(12) United States Patent
Chen et al.

(10) Patent No.: US 10,121,929 B2
(45) Date of Patent: Nov. 6, 2018

(54) OPTICAL DEVICE AND METHOD OF MANUFACTURING THE SAME

(71) Applicant: Advanced Semiconductor Engineering, Inc., Kaohsiung (TW)

(72) Inventors: Po-Nien Chen, Kaohsiung (TW); Yu-Ting Chien, Kaohsiung (TW); Yueh-Lung Lin, Kaohsiung (TW); Tsung-Yueh Tsai, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/462,480

(22) Filed: Mar. 17, 2017

(65) Prior Publication Data

US 2018/0269347 A1    Sep. 20, 2018

(51) Int. Cl.
| | | |
|---|---|---|
| H01L 31/167 | (2006.01) | |
| H01L 33/44 | (2010.01) | |
| H01L 33/62 | (2010.01) | |
| H01L 33/54 | (2010.01) | |
| H01L 31/0216 | (2014.01) | |
| H01L 31/02 | (2006.01) | |
| H01L 31/18 | (2006.01) | |
| H01L 25/16 | (2006.01) | |

(52) U.S. Cl.
CPC .......... H01L 31/167 (2013.01); H01L 25/167 (2013.01); H01L 31/02005 (2013.01); H01L 31/02164 (2013.01); H01L 31/1876 (2013.01); H01L 33/44 (2013.01); H01L 33/54 (2013.01); H01L 33/62 (2013.01); *H01L 2933/005* (2013.01); *H01L 2933/0025* (2013.01)

(58) Field of Classification Search
CPC ......... H01L 27/14623; H01L 27/14685; H01L 27/14627; H01L 27/14609; H01L 31/02164; H01L 31/167
See application file for complete search history.

(56) References Cited

U.S. PATENT DOCUMENTS

| | | | | |
|---|---|---|---|---|
| 8,604,436 B1* | 12/2013 | Patel | ....................... | H01L 25/50 |
| | | | | 250/338.1 |
| 9,746,349 B2* | 8/2017 | Rudmann | ................ | G01D 5/40 |
| 9,865,765 B2* | 1/2018 | Hsu | ....................... | H01L 31/173 |

\* cited by examiner

*Primary Examiner* — Quoc Hoang
(74) *Attorney, Agent, or Firm* — Foley & Lardner LLP; Cliff Z. Liu

(57) ABSTRACT

An optical device includes a carrier including a light transmitting layer and a light shielding layer disposed on the light transmitting layer. The optical device further includes a light emitter disposed on the carrier and a light detector disposed on the carrier. The optical device further includes a light transmitting encapsulant encapsulating the light emitter and the light detector, and a light shielding wall disposed in the light transmitting encapsulant and in contact with the light transmitting encapsulant and the light shielding layer.

21 Claims, 13 Drawing Sheets

_(1)_

OPTICAL DEVICE AND METHOD OF MANUFACTURING THE SAME

BACKGROUND

1. Technical Field

The present disclosure relates to a semiconductor package device, and more particularly, to a semiconductor package device including light emitting components.

2. Description of the Related Art

Light Emitting Diodes (LEDs), or laser diodes, are widely used for many applications. A semiconductor light emitting device can include an LED chip having one or more semiconductor layers. The layers can be configured to emit coherent and/or incoherent light when energized. During manufacture, a large number of LED semiconductor dies can be produced on a semiconductor wafer. The wafer can be probed and tested to accurately identify particular color characteristics of each die, such as color temperature. Then, the wafer can be singulated to cut the wafer into a plurality of LED chips. The LED chips can be packaged to provide external electrical connections, heat sinking, lenses or wave-guides, environmental protection, and/or other features.

An LED chip can be used in an optical module, for example, a proximity sensor, and can be used to sense an object nearby the optical module. The optical module can have a light-emitting source and an optical detector, wherein the optical detector can receive or sense light emitted by the light-emitting source and reflected by an external or nearby object, for example, infrared light, so that the presence of the external approaching object can be detected. When an optical detector directly receives a light that is emitted from the light-emitting source, or receives light reflected from a medium different than the target object, there may be "cross talk," which can be considered noise and may lead to malfunction of the sensor. It can be desirable to reduce such cross talk.

SUMMARY

In some embodiments, according to an aspect, an optical device includes a carrier including a light transmitting layer and a light shielding layer disposed on the light transmitting layer. The optical device further includes a light emitter disposed on the carrier and a light detector disposed on the carrier. The optical device further includes a light transmitting encapsulant encapsulating the light emitter and the light detector, and a light shielding wall disposed in the light transmitting encapsulant and in contact with the light transmitting encapsulant and the light shielding layer.

In some embodiments, according to another aspect, an optical module includes a carrier, a light emitter disposed on the carrier, and a light detector disposed on the carrier. The optical module further includes a light shielding layer disposed on the carrier between the emitter and the detector, and a light transmitting encapsulant encapsulating the light emitter, the light detector and the light shielding layer. The optical module further includes a light shielding wall disposed on the carrier between the light emitter and the light detector. The light shielding wall contacts the light shielding layer.

In some embodiments, according to another aspect, a method for manufacturing an optical device includes providing a substrate, forming at least one emitter and at least one detector on the substrate, and forming a light shielding layer on the substrate between the emitter and the detector. The method further includes forming a light transmitting encapsulant that covers the light shielding layer, the emitter and the detector, removing a portion of the light transmitting encapsulant to form a cavity that exposes the light shielding layer, and forming a light shielding wall in the cavity that contacts the light shielding layer.

Figure 1:
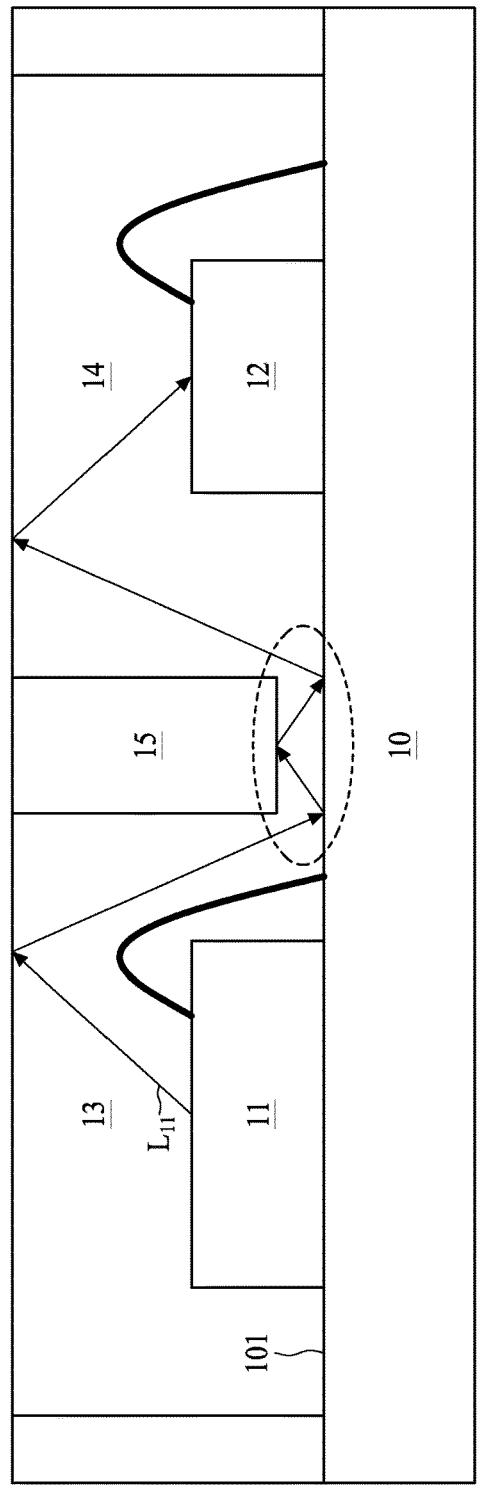
FIG. 1 illustrates a cross-sectional view of a semiconductor package device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1 illustrates a cross-sectional view of a semiconductor package device 1 in accordance with some embodiments of the present disclosure. The semiconductor package device 1 includes a carrier 10, electronic components 11, 12, package bodies 13, 14 and a wall structure 15.

The carrier 10 may include, for example, a substrate, a printed circuit board, such as a paper-based copper foil laminate, a composite copper foil laminate, or a polymer-impregnated glass-fiber-based copper foil laminate. The carrier 10 may include an interconnection structure, such as a conductive trace or a redistribution layer (RDL) and a dielectric layer such as prepreg layer or a polyimide layer.

The electronic component 11 is disposed on a top surface 101 of the carrier 10. In some embodiments, the electronic component 11 may be a light emitter or a light emitting device, such as an LED or other emitting die. For example, the electronic component 11 may include a light-emitting diode, a laser diode, or another device that may include one or more semiconductor layers. The semiconductor layers may include silicon, silicon carbide, gallium nitride, or any other semiconductor materials. The electronic component 11 can be connected to the carrier, for example, by way of flip-chip or wire-bond techniques. The electronic component 11 may emit a light in the infrared wavelength.

The electronic component 12 is disposed on the top surface 101 of the carrier 10 and is physically separated from the electronic component 11. In some embodiments, the electronic component 12 may be a light detector which is a PIN diode or a photo-diode or a photo-transistor. The electronic component 12 can be connected to the carrier, for example, by way of flip-chip or wire-bond techniques.

The package body 13 is disposed on the top surface 101 of the carrier 10 and covers the electronic component 11. In some embodiments, the package body 13 includes an epoxy resin. In some embodiments, the package body 13 is light transmitting.

The package body 14 is disposed on the top surface 101 of the carrier 10 and covers the electronic component 12. In some embodiments, the package body 14 includes an epoxy resin. In some embodiments, the package bodies 13 and 14 include one or more same materials. In some embodiments, the package bodies 13 and 14 include one or more different materials. In some embodiments, the package bodies 13 and 14 can be formed individually and physically separate from each other. Alternatively, the package bodies 13 and 14 can be formed by a single molding process, and then a cutting process can be carried out to separate the package bodies 13 and 14.

The wall structure 15 is disposed on the top surface 101 of the carrier 10 between the electronic component 11 and the electronic component 12. The wall structure 15 is substantially opaque, and can help to prevent undesired light emitted by the electronic component 11 from being directly transmitted to the electronic component 12. In some embodiments, the wall structure 15 may be an opaque liquid crystal polymer (LCP) cap.

During a process of forming the package bodies 13, 14 over the electronic components 11, 12, a mold may be disposed on the top surface 101 of the carrier 10 and then molding compound is injected into a space defined by the mold and the carrier 10, and covers the electronic components 11, 12. In some embodiments, a portion of the deposited molding compound may flush or runoff to a location of the top surface 101 of the carrier 10 marked by a dotted-line circle (i.e., over-bleeding). After forming the package bodies 13, 14, the mold is removed and the wall structure 15 is then placed on the location marked by the dotted-line circle, over the runoff portion of molding compound. The runoff portion of molding compound under the wall structure 15 may allow undesired light from the electronic component 11 to be directly transmitted to the electronic component 12 (e.g., through the light path $L_{11}$), which could cause crosstalk and may make the electronic component 12 malfunction.

Figure 2A:
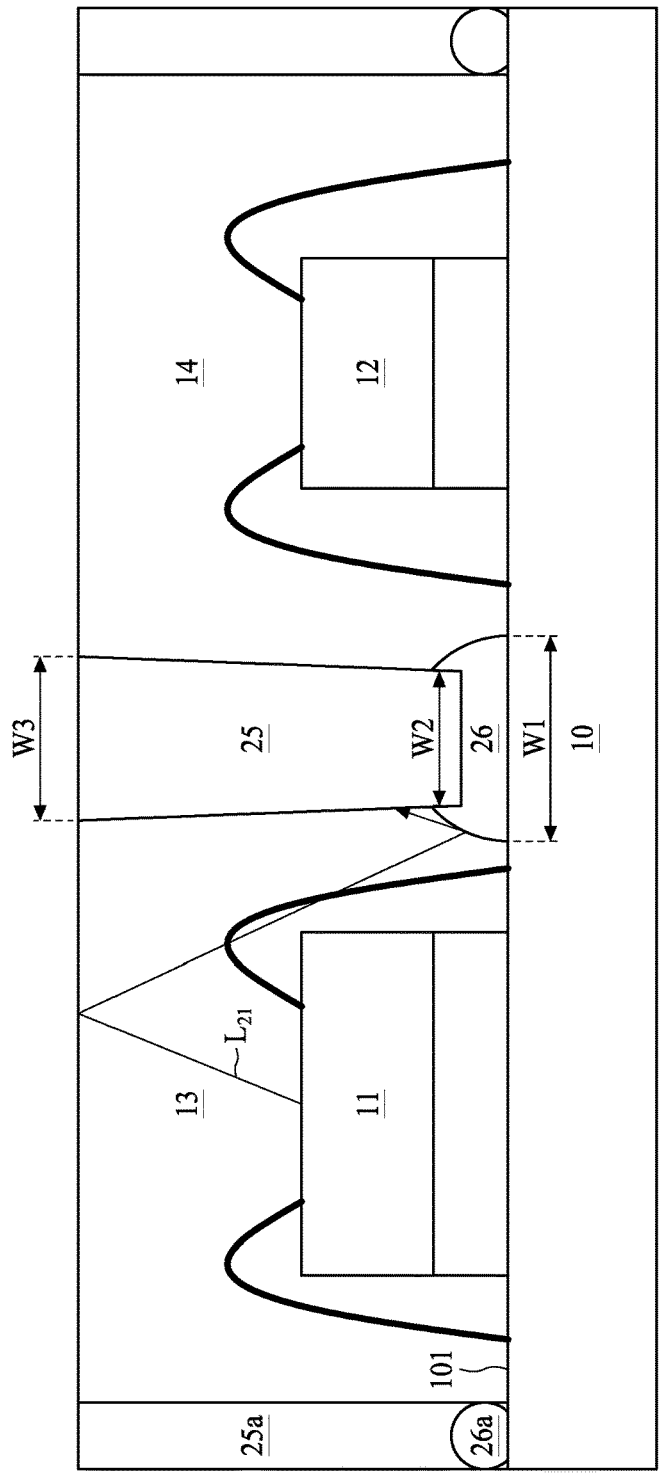
FIG. 2A illustrates a cross-sectional view of a semiconductor package device in accordance with some embodiments of the present disclosure.

FIG. 2A illustrates a cross-sectional view of a semiconductor package device 2 in accordance with some embodiments of the present disclosure. The semiconductor package device 2 is similar to the semiconductor package device 1 as shown in FIG. 1 except that the semiconductor package device 2 further includes a light shielding element 26.

The light shielding element 26 is disposed the top surface 101 of the carrier 10 between the electronic components 11 and 12. In some embodiments, the light shielding element 26 is formed of one or more opaque materials (such as an opaque glue). The light shielding element 26 has a recess in which the wall structure 25 is disposed. A width W2 of the recess is substantially equal to a width W3 of the wall structure 25. A width W1 of a base portion of the light shielding element 26, or of a widest portion of the light shielding element 26, is greater than the width W3 of the wall structure 25. In some embodiments, a light shielding element 26a may be disposed at one or more edges or ends of the carrier 10, and a frame 25a is disposed on the shielding element 26a. Alternatively, the light shielding element 26a disposed at the edge of the carrier 10 is not implemented and the frame 25a is directly disposed on the top surface 101 of the carrier 10. In some embodiments, two light shielding elements 26a are respectively disposed at two opposing ends of the carrier 10, and the frame 25a having two end portions is disposed on the two light shielding elements 26a such that each end portion is respectively disposed on at least one light shielding element 26a.

Since the light shielding element 26 is formed of one or more opaque materials, it can block, at least in part, light transmission between the electronic components 11 and 12. For example, the light shielding element 26 can help to prevent the light emitted by the electronic component 11 from entering the electronic component 12 through the lighting path $L_{21}$, and thereby improve the light blocking capability of the wall structure 25 in comparison with the wall structure 15 shown in FIG. 1. Therefore, forming the light shielding element 26 below the wall structure 25 could eliminate or reduce crosstalk interference and increase performance of the optical device.

Figure 2B:
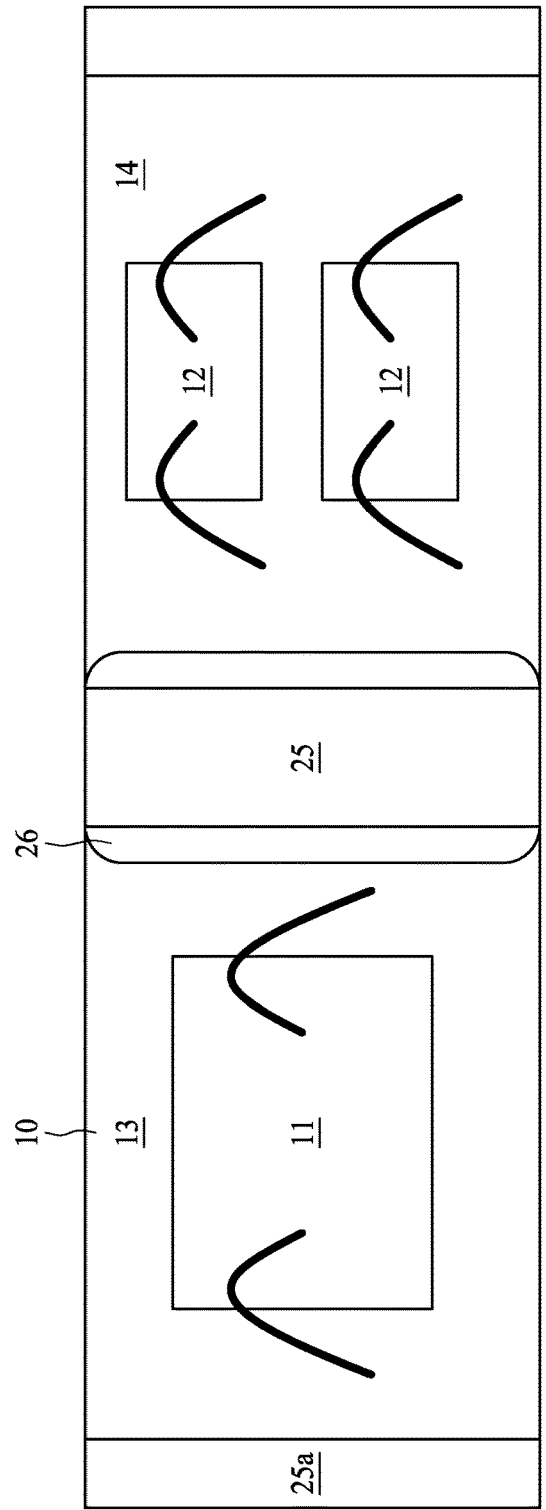
FIG. 2B illustrates a top view of a semiconductor package device in accordance with some embodiments of the present disclosure.

FIG. 2B illustrates a top view of a semiconductor package device 2 in accordance with some embodiments of the present disclosure. As shown in FIG. 2B, the wall structure 25 and the light shielding element 26 are disposed across the carrier 10 to help prevent the light emitted by the electronic component 11 from entering the electronic component 12, thus helping eliminate cross-talk interference.

Figure 3A:
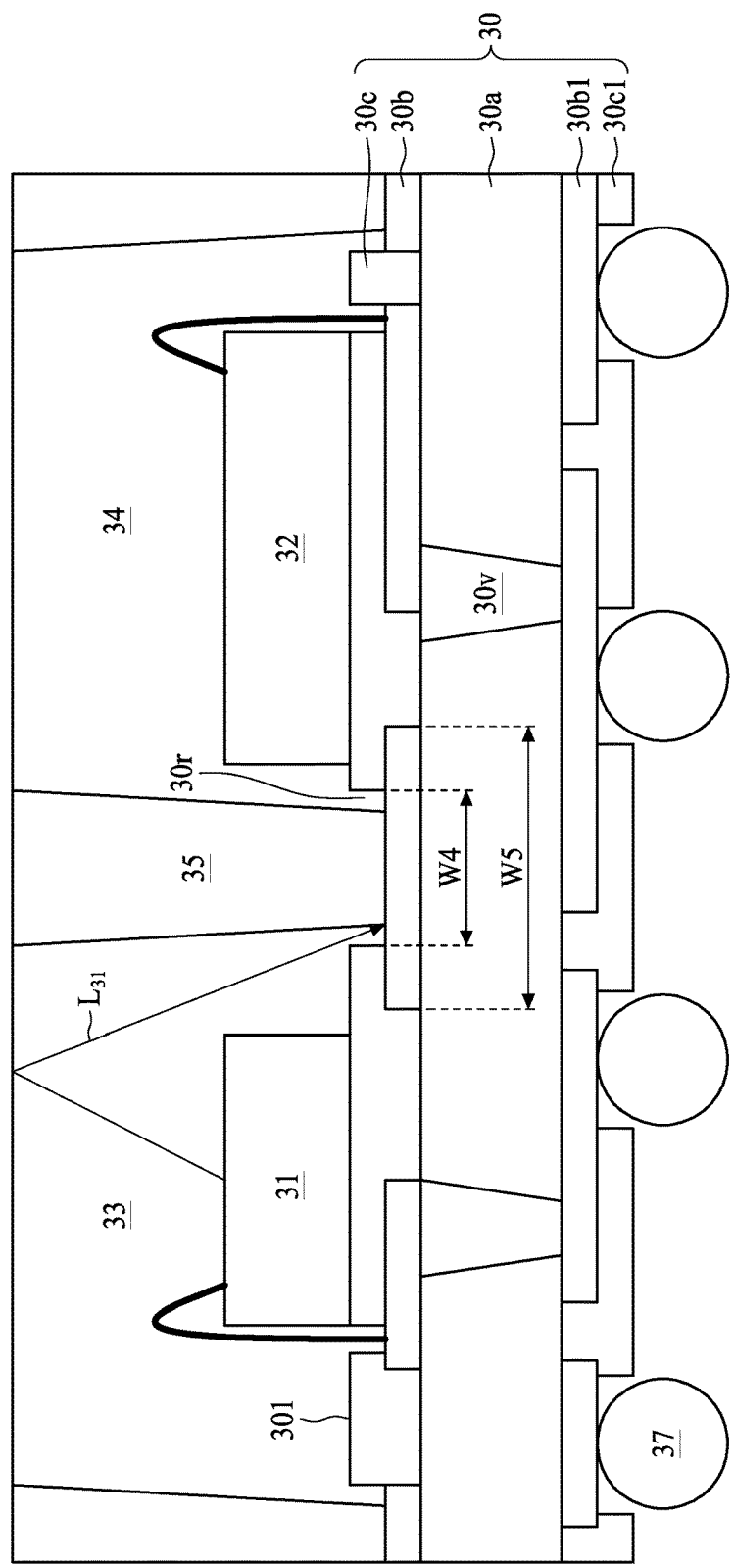
FIG. 3A illustrates a cross-sectional view of a semiconductor package device in accordance with some embodiments of the present disclosure.

FIG. 3A illustrates a cross-sectional view of a semiconductor package device 3 in accordance with some embodiments of the present disclosure. The semiconductor package device 3 includes a carrier 30, electronic components 31, 32, package bodies 33, 34 and a wall structure 35.

The carrier 30 may include, for example, a printed circuit board, such as a paper-based copper foil laminate, a composite copper foil laminate, or a polymer-impregnated glass-fiber-based copper foil laminate. The carrier 30 may include an interconnection structure, such as a conductive trace or a RDL and a dielectric layer such as prepreg layer or a polyimide layer. In some embodiments, the carrier 30 has a core layer 30a, metal layers 30b, 30b1, and solder masks (or solder resists) 30c, 30c1. The metal layer 30b is disposed on the core layer 30a and contacts the core layer 30a. The solder mask 30c is disposed on the metal layer 30b and exposes a portion of the metal layer 30b. In other embodiments, the carrier may include a core layer, multiple metal layers and prepreg layers. In some embodiments, a portion of the solder mask 30c is further disposed in one or more gaps defined by the metal layer 30b, and can contact a core layer or prepreg layer of the carrier.

Figure 3B:
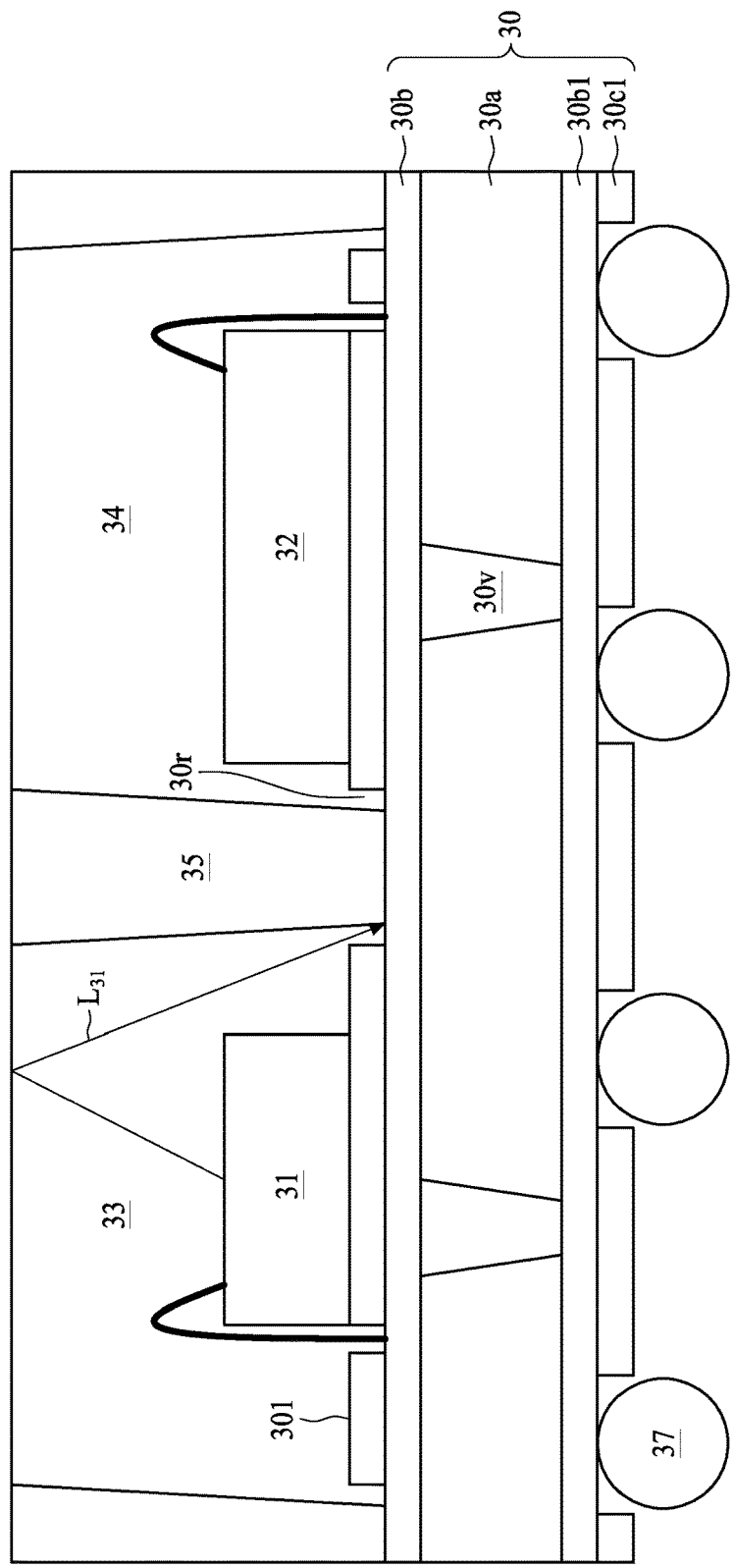
FIG. 3B illustrates a cross-sectional view of a semiconductor package device in accordance with some embodiments of the present disclosure.
Figure 3C:
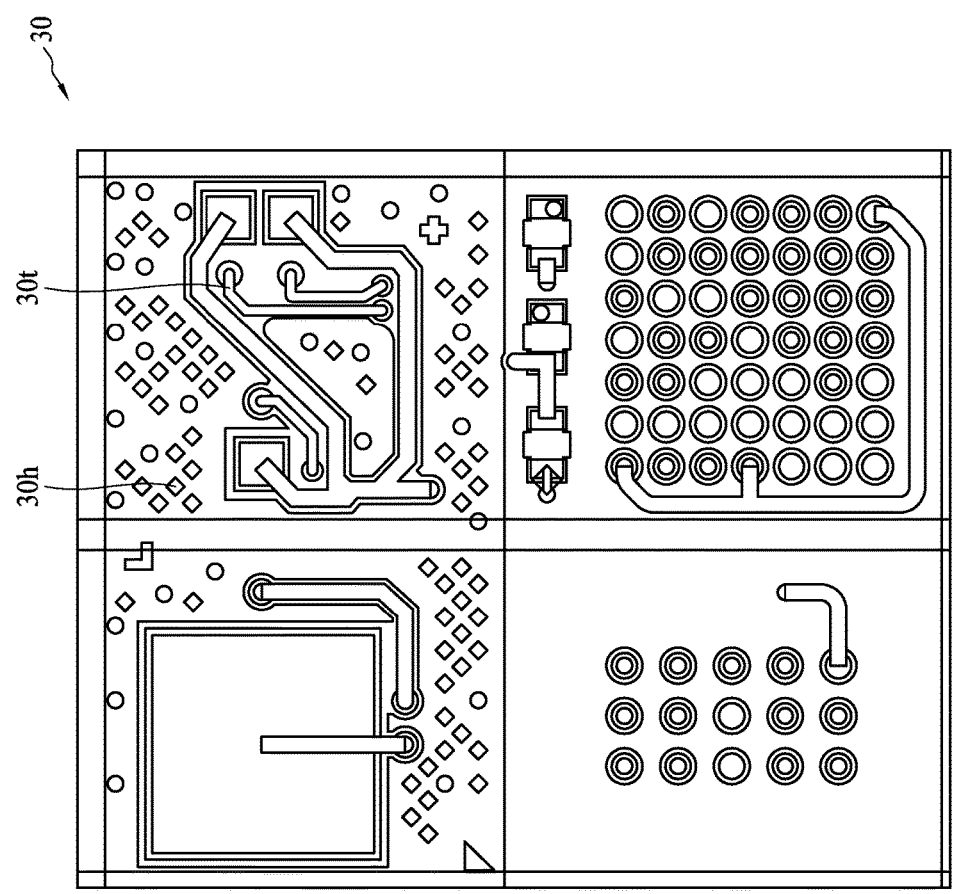
FIG. 3C illustrates a top view of a semiconductor package device in accordance with some embodiments of the present disclosure.

In some embodiments, the metal layer 30b is formed to cover a portion of the core layer 30a. In other embodiments, as shown in FIG. 3B, the metal layer 30b is formed to the extent of the entire area of the core layer 30a. The metal layer 30b may define a plurality of openings 30h (as shown in FIG. 3C) and thus help to prevent the carrier 30 from experiencing warpage (e.g. during a heating process), and may help to increase an adhesive force between the metal layer 30b and the core layer 30a. A portion of the metal layer 30b is exposed from the solder mask 30c. In some embodiments, a plurality of traces 30t are formed within the carrier 30 to provide electrical connections. At least some of the traces 30t and at least a portion of the metal layer 30b can be disposed in a same layer of the carrier (e.g. can be substantially in a same plane) and can be isolated from each other by one or more of the openings defined by the metal layer 30b. At least one of the traces 30t can be disposed in at least one of the openings 30h defined by the metal layer 30b.

The electronic component 31 is disposed on a top surface 301 of the carrier 30 (e.g. on the solder mask 30c). In some embodiments, the electronic component 31 may be a light emitting device, such as an LED or other die. For example, the electronic component 31 may include a light-emitting diode, a laser diode, or another device that may include one or more semiconductor layers. The semiconductor layers may include silicon, silicon carbide, gallium nitride, or any other semiconductor materials. The electronic component 31 can be connected to the carrier by way of, for example, flip-chip or wire-bond techniques.

The electronic component 32 is disposed on the top surface 301 of the carrier 30 (e.g. on the solder mask 30c) and is physically separated from the electronic component 31. In some embodiments, the electronic component 32 may be a light detector or a photo sensor. The electronic component 32 can be connected to the carrier by way of, for example, flip-chip or wire-bond techniques.

The wall structure 35 is disposed between the electronic component 31 and the electronic component 32. The wall structure 35 is disposed on a portion of the metal layer 30b that is exposed from the solder mask 30c. In some embodiments, the wall structure 35 is does not cover some, or does not cover any, of the openings defined by the metal layer 30b. The solder mask 30c defines a recess 30r in which the wall structure 35 is disposed. Therefore, a bottom surface of the wall structure 35 is not coplanar with the top surface 301 of the carrier 30 (e.g., a top surface of the solder mask 30c). For example, the bottom surface of the wall structure 35 is lower than the top surface 301 of the carrier 30. In some embodiments, the carrier 30 may include a core layer, multiple metal layers, prepreg layers and solder masks. The recess in which the wall structure 35 is disposed can be formed to expose any of the metal layers. For example, a recess may be formed by removing the solder mask to expose the top metal layer or a recess may be formed by removing the solder mask, the top metal layer and the prepreg layer to expose the metal layer that is adjacent to the core layer.

A width W5 of the metal layer 30b on which the wall structure 35 is disposed is greater than a width W4 of the recess 30r. Therefore, the wall structure 35 can help to prevent the light emitted by the electronic component 31 from entering the carrier 30. For example, the metal layer 30b can help to block the light transmitted through the light path $L_{31}$. The core layer 30a or the prepreg layer may include glass fibers that might provide a transmission path for light (and such a core layer 30a, prepeg layer 30a, and/or components thereof may be referred to herein as a light transmitting layer). Thus the metal layer 30b (which may be referred to herein as a light shielding layer) can help to prevent the light emitted by the electronic component 31 from entering the electronic component 32 through the glass fibers within the core layer 30a or the prepreg layer, which could eliminate or reduce the crosstalk interference and increase the performance of the optical device.

The wall structure 35 is substantially opaque and can help to prevent the undesired light emitted by the electronic component 31 from entering the electronic component 32. In some embodiments, the wall structure 35 may include, or may be implemented in conjunction with light absorbing material or light attenuated material such as carbon black or pigment to reduce the reflecting light from the internal surface of the wall structure 35.

The package body 33 is disposed on the top surface 301 of the carrier 30. The package body 33 covers the electronic component 31. In some embodiments, the package body 33 includes an epoxy resin. In some embodiments, the package body 33 is light transmitting.

The package body 34 is disposed on the top surface 301 of the carrier 30. The package body 34 covers the electronic component 32. In some embodiments, the package body 34 includes an epoxy resin. In some embodiments, the package bodies 33 and 34 include one or more same materials. In some embodiments, the package bodies 33 and 34 are include one or more different materials. In some embodiments, the package bodies 33 and 34 can be formed individually and physically separate from each other. Alternatively, the package bodies 33 and 34 can be formed by a single molding process, and then a cutting process can be carried out to separate the package bodies 33 and 34.

In some embodiments, the semiconductor package device 3 can be connected to other semiconductor package device (such as a field-programmable gate array (FPGA)) through conductive contacts 37 (e.g., solder balls). For example, the semiconductor package device 3 can be mounted on other semiconductor package device. A signal received from or detected by the electronic component 31 and/or the electronic component 32 can be transmitted to circuits of other semiconductor package devices through one or more through vias 30v (which, for example, electrically connect the metal layer 30b to one or more conductive contacts 37, and which can traverse the carrier core 30a) and the conductive contacts 37. In addition, a control signal can be transmitted from the circuits of other semiconductor package device to the electronic component 31 and/or the electronic component 32 through the through vias 30v and the conductive contacts 37. By directly mounting the semiconductor package device 3 on other semiconductor package device, the total size of a chip can be reduced.

FIGS. 4A, 4B, 4C and 4D illustrate a semiconductor package manufacture process, according to some embodiments of the present disclosure.

Figure 4A:
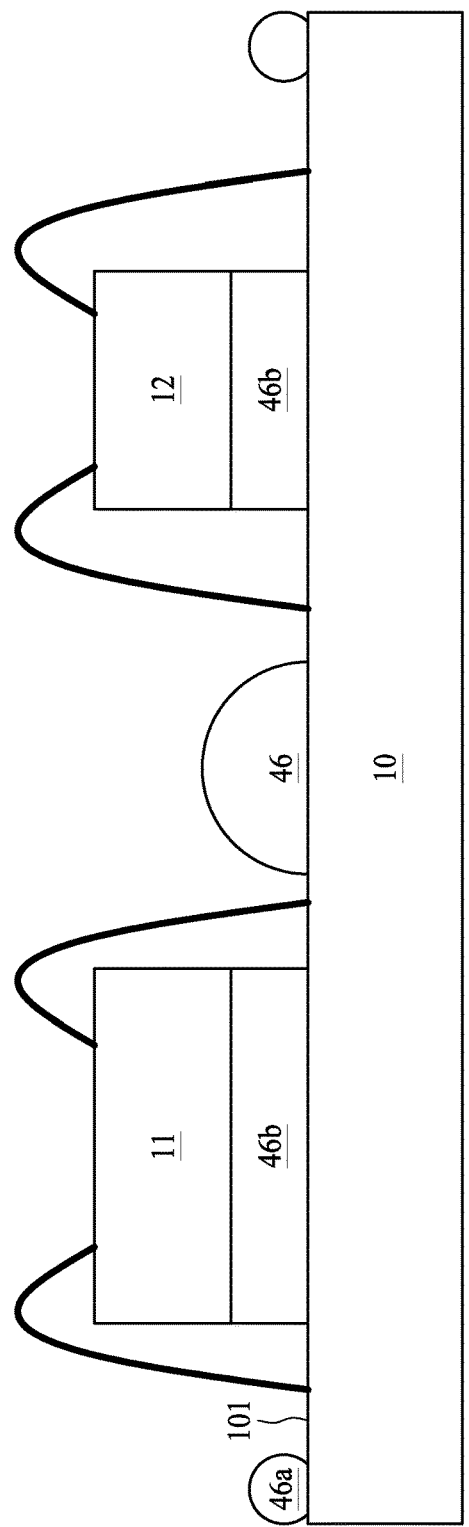
FIG. 4A, FIG. 4B, FIG. 4C and FIG. 4D illustrate a semiconductor package manufacture process, according to some embodiments of the present disclosure.

Referring to FIG. 4A, a carrier strip including multiple carriers 10 is provided, and the provision of the multiple carriers 10 allows multiple semiconductor package devices to be manufactured concurrently. In the below description, some processes relating to a single carrier 10 are described, but it should be understood that such processes can be applied to one, to more than one, or to all of the carriers 10 of the carrier strip, as appropriate.

Adhesive materials 46, 46a, 46b are applied on predetermined areas of the top surface 101 of the carrier 10. In some embodiments, the adhesive materials 46, 46a are formed of one or more opaque materials. In some embodiments, the operation of applying the adhesive material 46a can be omitted.

The electronic components 11 and 12 are then attached to the top surface 101 of the carrier 10 by the adhesive materials 46b. The electronic components 11, 12 are connected to conductive contacts of the carrier 10 by flip-chip or wire-bond techniques. In some embodiments, the electronic components 11, 12 shown in FIG. 4A are the same as the electronic components 11, 12 shown in FIG. 1 or FIG. 2A or FIG. 2B.

Figure 4B:
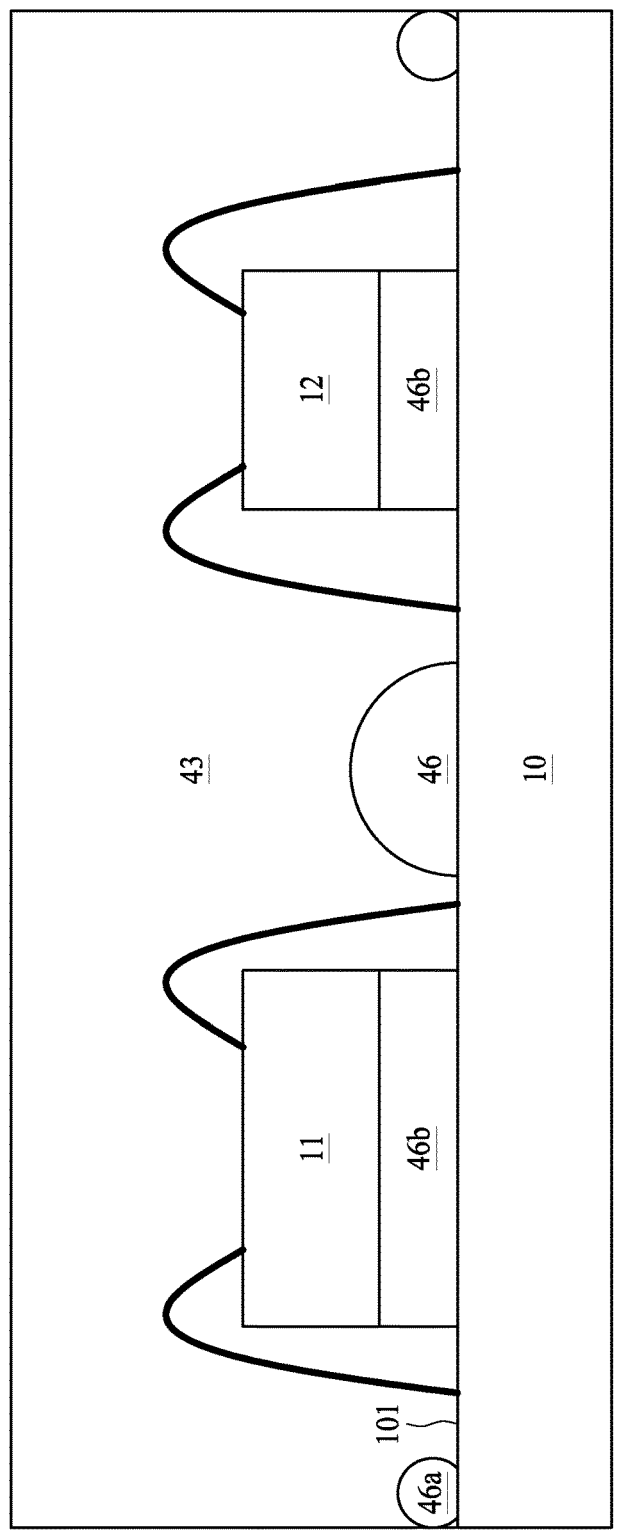

Referring to FIG. 4B, a package body 43 is formed on the top surface 101 of the carrier 10 and encapsulates a part of the top surface 101 of the carrier 10, the electronic components 11, 12 and the adhesive materials 46, 46a. In some embodiments, the package body 43 includes an epoxy resin. In some embodiments, the package body 43 is light transmitting. The package body 43 may be formed by a molding technique, such as transfer molding or compression molding.

Figure 4C:
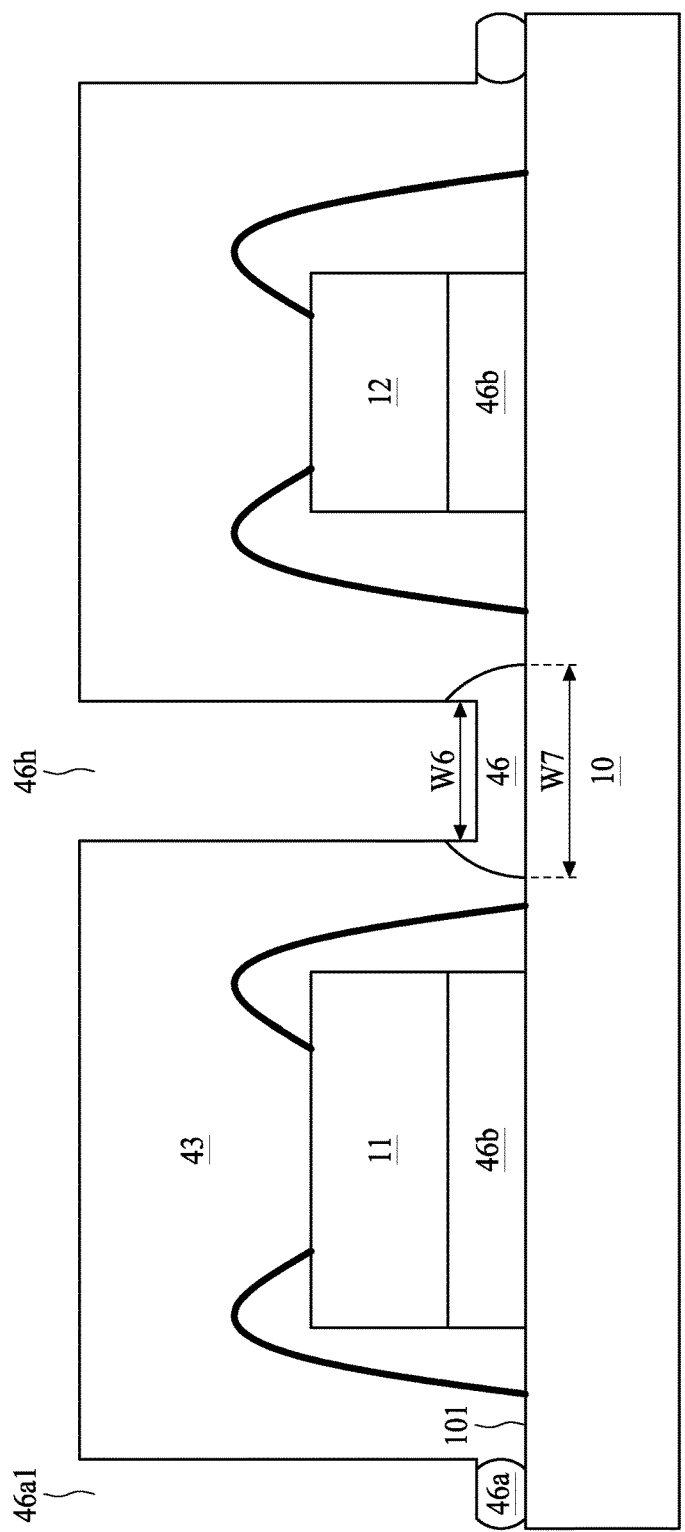

Referring to FIG. 4C, an opening 46h is formed in the package body 43 and in the adhesive material 46 by removing a portion of the package body 43 and a portion of the adhesive material 46 to expose a remaining portion of the adhesive material 46. A width W6 of the opening 46h can be set as appropriate for design specifications. The width W6 of the opening 46h is less than a width W7 of a base portion, or a widest portion, of the adhesive material 46. Openings 46a1 are formed by removing a portion of the package body 43 and a portion of the adhesive materials 46a to expose the remaining portion of the adhesive material 46a. In some embodiments, the openings 46h, 46a1 can be formed by cutting, drilling, laser drilling or other suitable techniques.

Figure 4D:
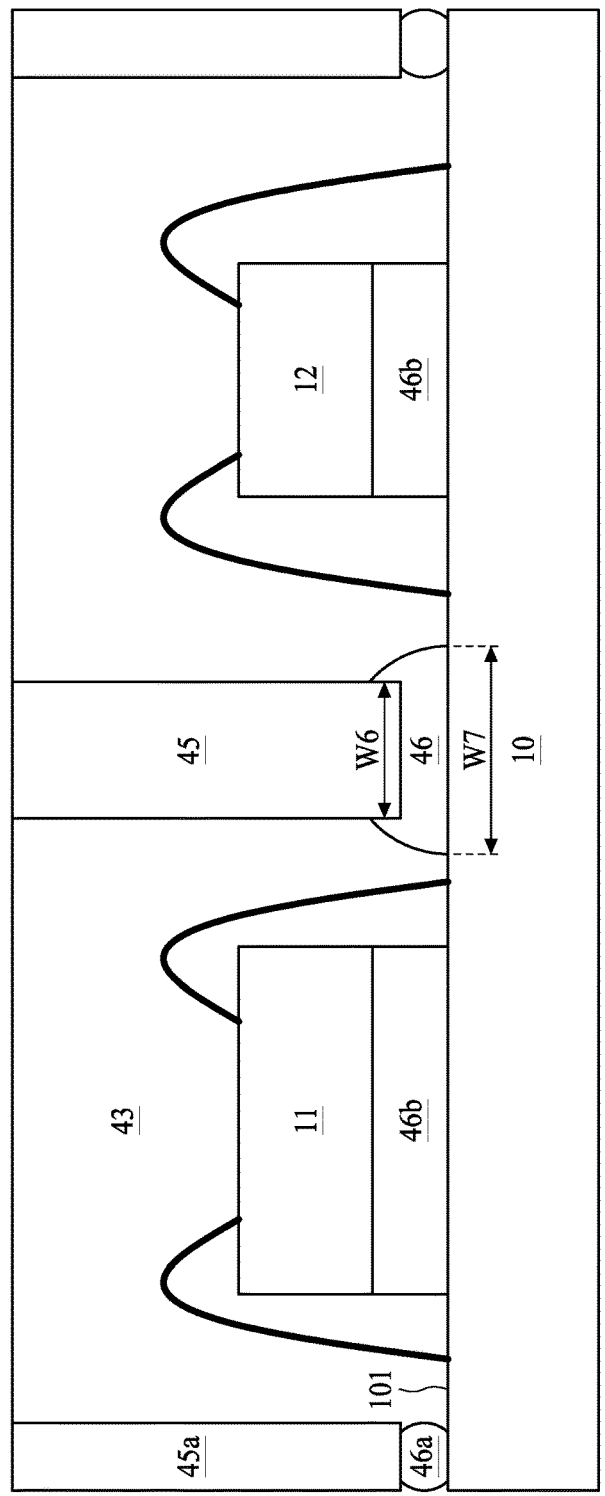

Referring to FIG. 4D, an opaque material is formed within the opening 46h to form a wall structure 45. In some embodiments, the wall structure 45 may include, or may be implemented in conjunction with light absorbing material or light attenuated material such as carbon black or pigment to reduce the reflecting light from the internal surface of the wall structure 45. In some embodiments, the wall structure 45 may be formed by a molding technique, such as transfer molding or compression molding.

Then, singulation may be performed to separate out individual semiconductor package devices. That is, the singulation may be performed through the package body 43 and the carrier strip including the carriers 10. The singulation may be performed, for example, by using a dicing saw, laser or other appropriate cutting technique. A frame 45a can be placed on the adhesive material 46a to form the semiconductor package device 2 as shown in FIG. 2A.

Figure 5A:
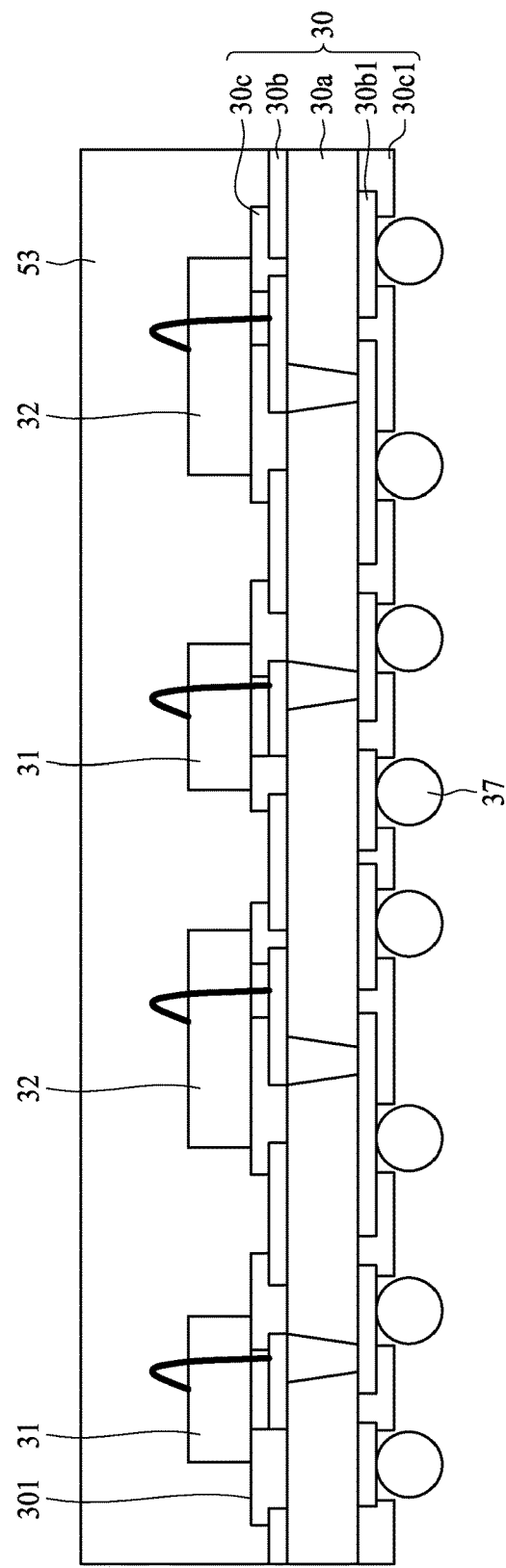
FIG. 5A, FIG. 5B and FIG. 5C illustrate a semiconductor package manufacture process, according to some embodiments of the present disclosure.
Figure 5B:
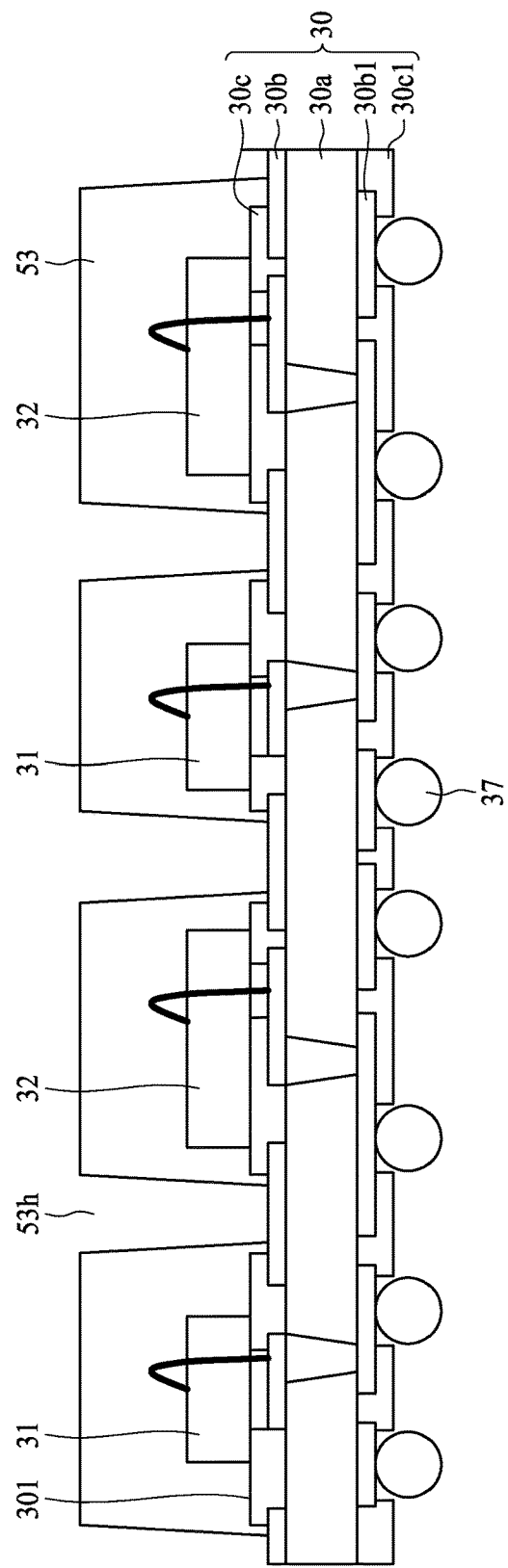
Figure 5C:
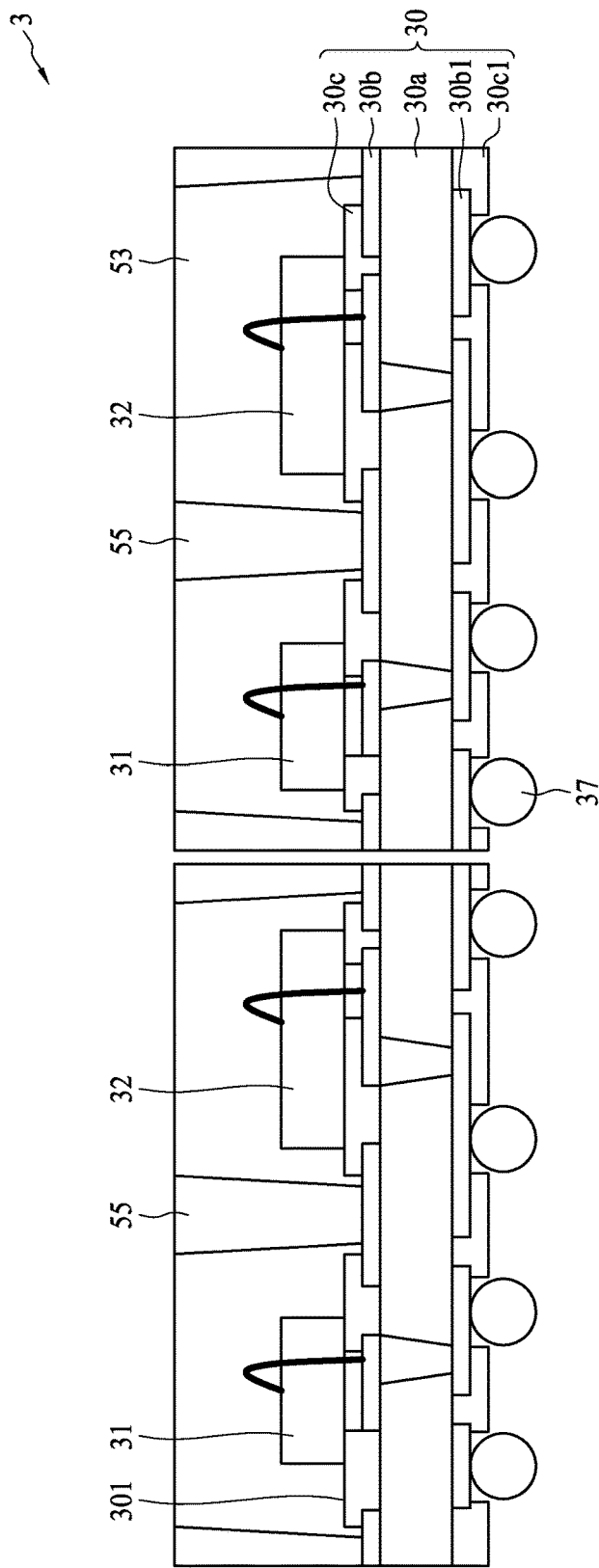

FIGS. 5A, 5B and 5C illustrate a semiconductor package manufacture process, according to some embodiments of the present disclosure.

Referring to FIG. 5A, a carrier strip including multiple carriers 30 is provided, and the provision of the multiple carrier 30 allows multiple semiconductor package devices to be manufactured concurrently. In some embodiments, the carrier 30 shown in FIG. 5A is the same as the carrier 30 shown in FIG. 3A. In the below description, some processes relating to a single carrier 10 are described, but it should be understood that such processes can be applied to one, to more than one, or to all of the carriers 10 of the carrier strip, as appropriate.

The electronic components 31 and 32 are formed on the top surface 301 of the carrier 30. The electronic components 31, 32 are connected to conductive contacts of the carrier 30 by flip-chip or wire-bond techniques. In some embodiments, the electronic components 31, 32 shown in FIG. 5A are the same as the electronic components 31, 32 shown in FIG. 3A.

A package body 53 is formed on the top surface 301 of the carrier 30 and encapsulates a part of the top surface 301 of the carrier 30 and the electronic components 31, 32. In some embodiments, the package body 53 includes an epoxy resin. In some embodiments, the package body 53 is light transmitting. The package body 53 may be formed by a molding technique, such as transfer molding or compression molding.

Referring FIG. 5B, openings 53h are formed in the package body 53 and the solder mask 30c by removing a portion of the package body 53 and a portion of the solder mask 30c to expose a portion of the metal layer 30b of the carrier 30. In some embodiments, the openings 53h can be formed by cutting, drilling, laser drilling or other suitable techniques. The metal layer 30b can help to protect the conductive trances or the core layer 30a within the carrier 30 from being damaged during the operation of forming the openings 53h (e.g. can act as a cutting barrier).

Referring to FIG. 5C, an opaque material is formed within the opening 53h to form a wall structure 55. In some embodiments, the wall structure 55 may include, or may be implemented in conjunction with light absorbing material or light attenuated material such as carbon black or pigment to reduce the reflecting light from the internal surface of the wall structure 55. In some embodiments, the wall structure 55 may be formed by a molding technique, such as transfer molding or compression molding.

Then, singulation may be performed to separate out individual semiconductor package devices to form the semiconductor package device 3 as shown in FIG. 3A. That is, the singulation may be performed through the package body 53 and the carrier strip including the carriers 30. The singulation may be performed, for example, by using a dicing saw, laser or other appropriate cutting technique.

As mentioned above, the semiconductor package device 3 can be mounted on other semiconductor package device (such as a FPGA) through conductive contacts 37 (e.g., solder balls). In some embodiments, the process of manufacturing a chip with the semiconductor package device 3 mounted on another semiconductor package device may include the following steps: (i) after the operation shown in FIG. 5A, mounting the semiconductor package device 3 on another semiconductor package device through the conductive contacts 37; (ii) forming the openings 53h as shown in FIG. 5B; and (iii) forming a package body having fillers dispersed therein within the openings 53h to cover or to encapsulate both the semiconductor package device 3 and another semiconductor package device. In other embodiments, the step of mounting the semiconductor package device 3 on another semiconductor package device can be carried out after the operation shown in FIG. 5B. By molding the semiconductor package device 3 and another semiconductor package device in one single molding process, the manufacturing cost and time can be reduced.

In the description of some embodiments, a component provided "on" another component can encompass cases where the former component is directly on (e.g., in physical contact with) the latter component, as well as cases where one or more intervening components are located between the former component and the latter component.

In the description of some embodiments, a component characterized as "light transmitting" can refer to such a component as having a light transmittance of at least 80%, such as at least 85% or at least 90%, over a relevant wavelength or a relevant range of wavelengths, such as a peak infrared wavelength or a range of infrared wavelengths emitted by a light emitter. In the description of some embodiments, a component characterized as "light shielding" can refer to such a component as having a light transmittance of no greater than 20%, such as no greater than 15% or no greater than 10%, over a relevant wavelength or a relevant range of wavelengths, such as a peak infrared wavelength or a range of infrared wavelengths emitted by a light emitter.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

While the present disclosure has been described and illustrated with reference to specific embodiments thereof, these descriptions and illustrations do not limit the present disclosure. It will be clearly understood by those skilled in the art that various changes may be made, and equivalents may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it should be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optical device, comprising:
   a carrier including a light transmitting layer and a light shielding layer disposed on the light transmitting layer;
   a light emitter disposed on the carrier;
   a light detector disposed on the carrier;
   a light transmitting encapsulant encapsulating the light emitter and the light detector; and
   a light shielding wall disposed in the light transmitting encapsulant and in contact with the light transmitting encapsulant and the light shielding layer.

2. The optical device of claim 1, wherein the light shielding layer is a metal layer and the metal layer is formed to the extent of an entire area of the light transmitting layer.

3. The optical device of claim 2, wherein the metal layer defines a plurality of openings.

4. The optical device of claim 3, wherein the carrier further comprises a plurality of traces, wherein at least a portion of some of the traces and at least a portion of the metal layer are disposed in a same layer of the carrier, and at least one of the traces is disposed in at least one of the openings defined by the metal layer.

5. The optical device of claim 4, wherein the light shielding wall does not cover any of the openings defined by the metal layer.

6. The optical device of claim 4, wherein the traces are electrically isolated from the metal layer.

7. The optical device of claim 6, wherein the light transmitting layer is a core layer comprising a plurality glass fibers disposed therein.

8. The optical device of claim 3, wherein the metal layer contacts the light transmitting layer.

9. The optical device of claim 8, wherein the carrier further comprises a dielectric layer disposed on the light transmitting layer and the metal layer, wherein the dielectric layer contacts the light transmitting layer through at least one of the openings defined by the metal layer.

10. The optical device of claim 1, wherein the carrier further comprises a solder resist disposed on the light shielding layer, and the solder resist defines a recess to expose at least a portion of the light shielding layer.

11. The optical device of claim 10, wherein the light shielding wall is disposed within the recess defined by the solder resist and on the light shielding layer.

12. The optical device of claim 11, wherein an area of the light shielding layer exposed from the solder resist is equal to or greater than an area of a bottom surface of the light shielding wall.

13. An optical module comprising:
    a carrier;
    a light emitter disposed on the carrier;
    a light detector disposed on the carrier;
    a light shielding layer disposed on the carrier between the emitter and the detector;
    a light transmitting encapsulant encapsulating the light emitter, the light detector and the light shielding layer; and
    a light shielding wall disposed on the carrier between the light emitter and the light detector, wherein the light shielding wall contacts the light shielding layer, and has a bottom surface that is disposed lower than a top surface of the carrier.

14. The optical module of claim 13, wherein the light shielding layer comprises an adhesive material.

15. The optical module of claim 14, wherein the adhesive material further comprises a light absorbing material.

16. The optical module of claim 15, wherein the light absorbing material is an infrared absorbing material.

17. The optical module of claim 13, wherein a width of a base of the light shielding layer is larger than a width of the light shielding wall.

18. The optical module of claim 17, wherein the light shielding layer defines a groove in which the light shielding wall is disposed.

19. The optical module of claim 18, wherein a width of the groove of the light shielding layer is substantially equal to the width of the light shielding wall.

20. The optical module of claim 13, wherein the carrier further comprises a metal layer contacting the light shielding layer.

21. The optical module of claim 13, wherein the light shielding wall and the light shielding layer are disposed across the carrier.

* * * * *